(12) United States Patent
Kubo et al.

(10) Patent No.: US 11,764,506 B2
(45) Date of Patent: Sep. 19, 2023

(54) CONNECTOR AND CONNECTOR PAIR

(71) Applicant: YAZAKI CORPORATION, Tokyo (JP)

(72) Inventors: Toshitaka Kubo, Tsukuba (JP); Kazuhiko Seki, Tsukuba (JP); Mitsuhiro Okada, Tsukuba (JP); Kazuto Hatakeyama, Tsukuba (JP); Kenji Koga, Tsukuba (JP); Tetsuo Shimizu, Tsukuba (JP); Nan Ye, Susono (JP); Hiroki Kawai, Susono (JP)

(73) Assignee: YAZAKI CORPORATION, Tokyo (JP)

( * ) Notice: Subject to any disclaimer, the term of this patent is extended or adjusted under 35 U.S.C. 154(b) by 494 days.

(21) Appl. No.: 17/159,077

(22) Filed: Jan. 26, 2021

(65) Prior Publication Data

US 2021/0234295 A1 Jul. 29, 2021

(30) Foreign Application Priority Data

Jan. 27, 2020 (JP) .................. 2020-010601

(51) Int. Cl.
  *H01R 13/03* (2006.01)
  *H01B 1/02* (2006.01)
  *C23C 16/22* (2006.01)
  *C23C 16/04* (2006.01)

(52) U.S. Cl.
  CPC ............ *H01R 13/03* (2013.01); *C23C 16/04* (2013.01); *C23C 16/22* (2013.01); *H01B 1/02* (2013.01)

(58) Field of Classification Search
  CPC ........ H01R 13/03; H01R 13/02; H01R 24/00; C23C 16/04; C23C 16/22; H01B 1/02
  See application file for complete search history.

(56) References Cited

U.S. PATENT DOCUMENTS

| 2018/0226754 A1* | 8/2018 | Rhinehart, Jr. .... H01R 13/6599 |
| 2019/0210879 A1 | 7/2019 | Mori et al. |
| 2019/0305476 A1* | 10/2019 | Kralik .................. H01R 13/562 |
| 2021/0104825 A1 | 4/2021 | Kawai |

FOREIGN PATENT DOCUMENTS

| CN | 207572578 U | 7/2018 | |
| CN | 108471959 A | * 8/2018 | .......... A61B 5/1473 |
| JP | 2009-26500 A | 2/2009 | |
| JP | 2012-237055 A | 12/2012 | |
| JP | 2018-56119 A | 4/2018 | |
| JP | 2021-57313 A | 4/2021 | |

* cited by examiner

*Primary Examiner* — Jean F Duverne
(74) *Attorney, Agent, or Firm* — KENEALY VAIDYA LLP

(57) ABSTRACT

A connector pair includes a first connector, and a second connector electrically connected to the first connector. The first connector includes a first electrical contact part provided with a graphene film on a metal base material. The second connector includes a second electrical contact part electrically connected to the first connector via the graphene film. A contact area between the first electrical contact part and the second electrical contact part is smaller than an area of the graphene film coating the metal base material.

6 Claims, 17 Drawing Sheets

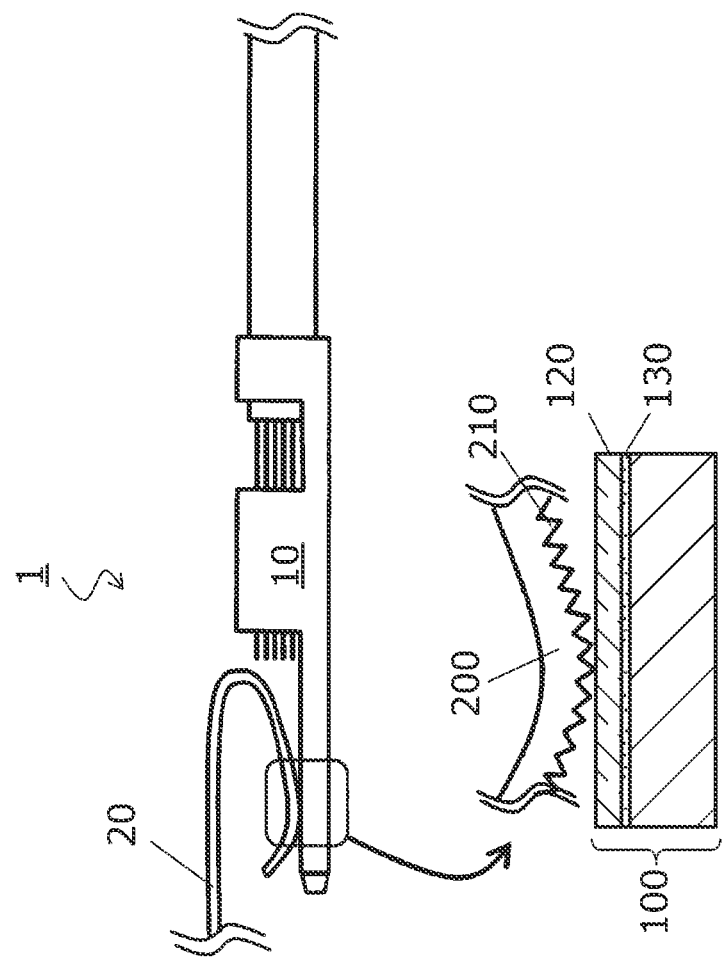

CONNECTOR AND CONNECTOR PAIR

CROSS REFERENCE TO RELATED APPLICATIONS

This application claims priority from Japanese Patent Application No. 2020-010601 filed on Jan. 27, 2020, the entire contents of which are incorporated herein by reference.

BACKGROUND OF THE INVENTION

Field of the Invention

The present invention relates to a connector and a connector pair.

Description of Related Art

A surface of a connector that connects electric wires to each other or between an electric wire and an electric device is usually coated with metal plating or the like in order to protect a contact portion of connector terminals.

However, since a metal other than gold oxidizes to varying degrees under a usage environment of the connector, even if the metal is coated on the surface, depending on the usage environment and conditions, oxidation may generate oxides with high electrical resistance, which may increase electrical resistance of the contact portion.

A deterioration of such electric contact, in particular, a decrease in conductivity, leads to a decrease in reliability such as an increase in power loss or conduction failure of the connector, which is problematic.

On the other hand, when a contact surface of the electric contact is plated with gold, there is almost no possibility of deterioration due to oxidation, but there is a problem that manufacturing cost is high because the gold is an expensive material.

Therefore, various measures are studied in order to prevent the oxidation on a surface of the electric contact and the resulting decrease in the conductivity at low cost.

In a related art, a layer made of graphene is stacked on a copper foil or a copper substrate to form an electrical contact part.

In a related art, a metal layer made of Ni, Sn, Al, Zn, Cu, In, or an alloy of the metals is formed on a base material, after removing an oxide layer formed after the formation of the metal layer, a surface of the metal layer is oxidized or hydroxylated to form a conductive oxide layer or a conductive hydroxide layer to form an electrical contact part for a connector.

[Patent Literature 1] JP-A-2018-56119
[Patent Literature 2] JP-A-2012-237055

According to a related art, since a coating having an electrical resistor value is added on a base material even though the electrical resistor value is low, the state is equivalent to a case where electrical resistors are connected in series, and an initial electrical resistor value (before deterioration occurs) increases as compared with a case where the electrical contact part is formed by the base material alone.

SUMMARY

One or more embodiments provide a connector and a connector pair having a low electrical resistor value in which a decrease in conductivity due to oxidation is prevented.

In an aspect, a connector pair includes a first connector, and a second connector electrically connected to the first connector. The first connector includes a first electrical contact part provided with a graphene film on a metal base material. The second connector includes a second electrical contact part electrically connected to the first connector via the graphene film. A contact area between the first electrical contact part and the second electrical contact part is smaller than an area of the graphene film coating the metal base material.

BRIEF DESCRIPTION OF THE DRAWINGS

FIG. 1A shows a case where there is no conductive coating on the resistor film, and FIG. 1B shows a case where there is a conductive coating on the resistor film (resistor value: $R_c$).

FIG. 6 is a diagram showing an example of a shape of a connector pair according to an embodiment of the present invention.

DETAILED DESCRIPTION

Hereinafter, the present invention will be described in detail based on an embodiment, but the present invention is not limited to the embodiment.

[Mechanism of Decrease in Electrical Resistance by Graphene Film Formation]

As described above, an electrical resistor value in a thickness direction of an electrical contact part coated with a graphene film on a surface is significantly lower than an electrical contact part without the graphene film. This mechanism is considered as follows.

In general, a surface of a metal base material is covered with a thin resistor film (resistor value: $R_l$) which has a higher electrical resistance than metal, due to oxidation under an influence of oxygen and moisture in the atmosphere, which is so-called rust. Although a thickness and an electrical resistor value of the resistor film (oxide film) change depending on an environment in which the metal base material is placed and an exposure time, as shown in a model of FIG. 1A, by defining an electrical resistor value $R_v$ in a vertical (thickness) direction of the resistor film as equal to $R_l$ derived from an electrical resistivity and by defining electrical resistors having a resistor value of $R_h$ in a horizontal (in-plane) direction for each length that is the same as in the vertical direction as resistors connected in series, it can be considered that both the electrical resistor value $R_v$ in the vertical direction and the resistor value $R_h$ in the horizontal direction are equal to $R_l$. Here, when a measurement terminal contacts with only a part of a surface of the resistor film and a voltage is applied, since the coating has the electrical resistor not only in the thickness direction but also in the in-plane direction, a potential difference occurs in the in-plane direction and a current flows. At this time, a combined resistor value ($R_{n+1}$) from an electrical resistor at a contact position of the measurement terminal to an electrical resistor in the thickness direction positioned at an (n+1)th position is expressed by the following Formula (1) by using a combined resistor value ($R_n$) until an n-th electrical resistor.

[Formula 1]

$$R_{n+1} = \frac{1}{\frac{1}{R_n + R_h} + \frac{1}{R_v}} = \frac{1}{\frac{1}{R_n + R_1} + \frac{1}{R_1}} \quad (1)$$

Figure 1B:
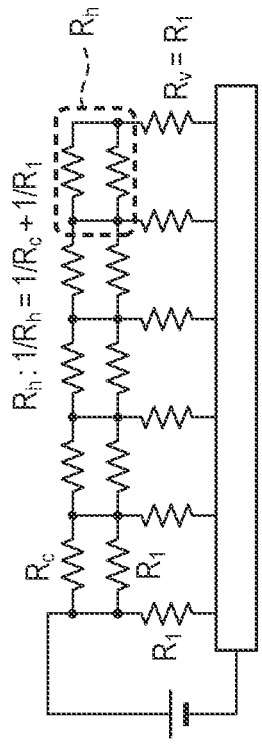
FIGS. 1A and 1B are diagrams of a circuit model in which a measurement terminal is brought into point contact with an electrical contact part having a uniform resistor film (resistor value: $R_1$) formed on a metal base material and a voltage is applied.
Figure 1A:
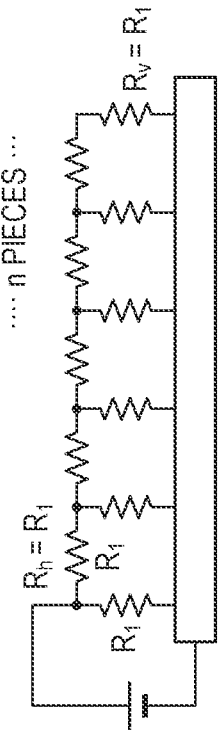
Figure 2:
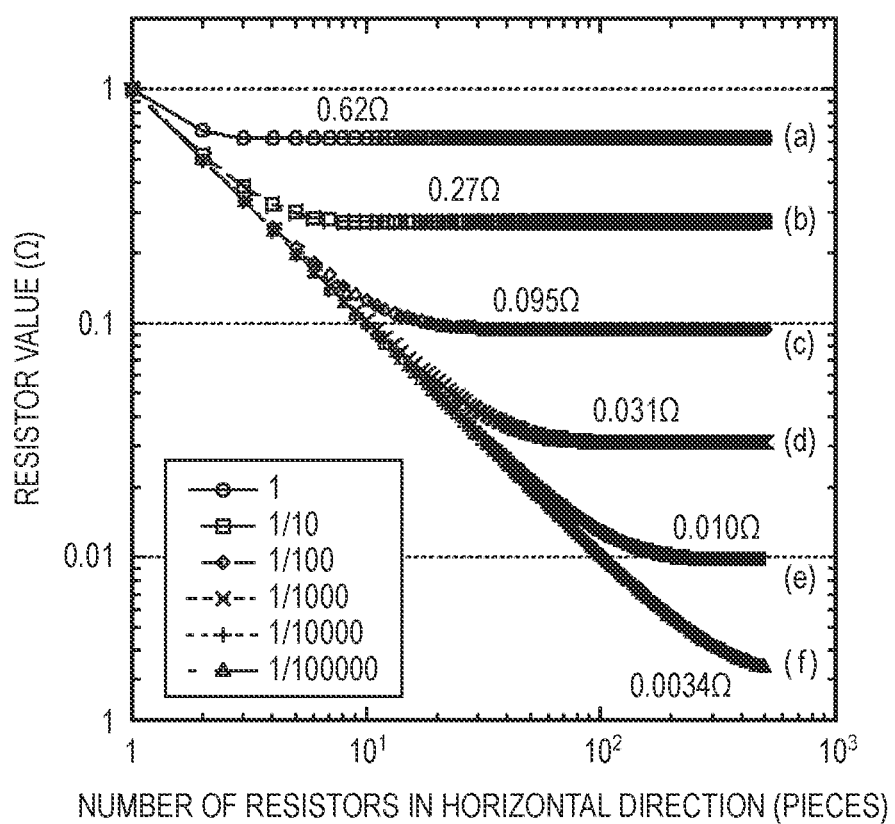
FIG. 2 is a graph showing calculation results of a combined resistor value when $R_f=1\Omega$ in the circuit model of FIGS. 1A and 1B. Plots (a) show a case where $R_h=R_v=R_f$ having no conductive coating on a surface. Plots (b) show a case where $R_h=10^{-1}R_v$ having a conductive coating on the surface. Plots (c) show a case where $R_h=10^{-2}R_v$. Plots (d) shows a case where $R_h=10^{-3}R_v$. Plots (e) shows a case where $R_h=10^{-4}R_v$. Plots (f) shows a case where $R_h=10^{-5}R_v$.
Figure 3:
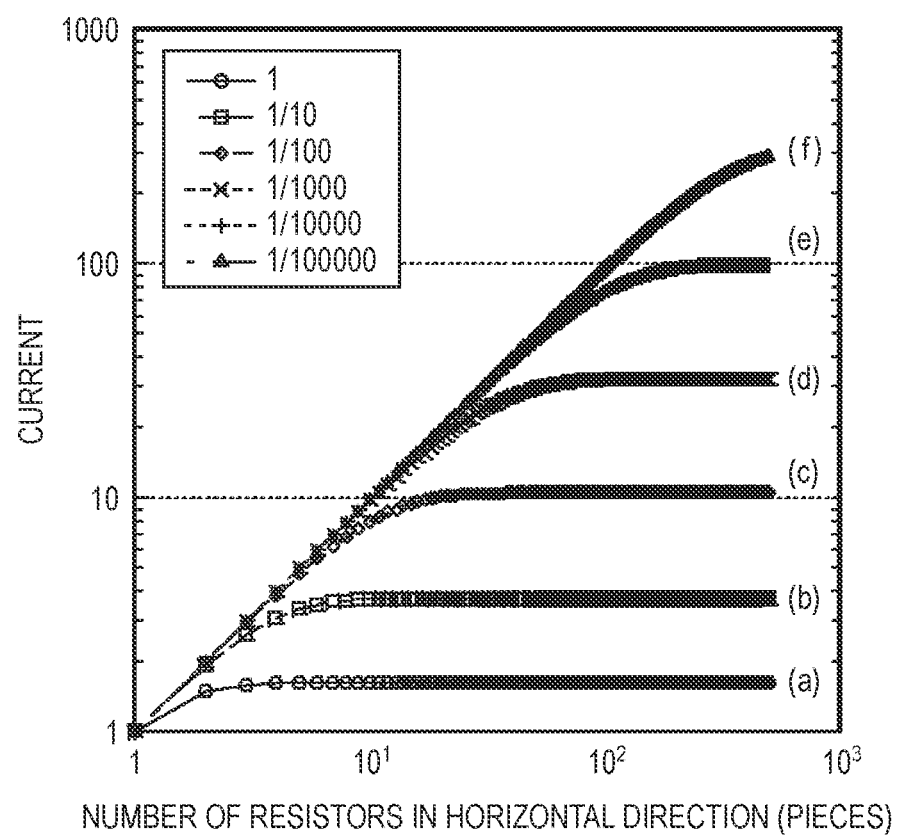
FIG. 3 is a graph showing calculation results of a total current value flowing through a circuit when $R_f=1\Omega$ and the voltage is 1 V in the circuit model of the present invention. Plots (a) show a case where $R_h=R_v=R_f$ having no conductive coating on the surface. Plots (b) show a case where $R_h=10^{-1}R_v$ having a conductive coating on the surface. Plots (c) show a case where $R_h=10^{-2}R_v$. Plots (d) show a case where $R_h=10^{-3}R_v$. Plots (e) show a case where $R_h=10^{-4}R_v$. Plots (f) show a case where $R_h=10^{-5}R_v$.
Figure 4:
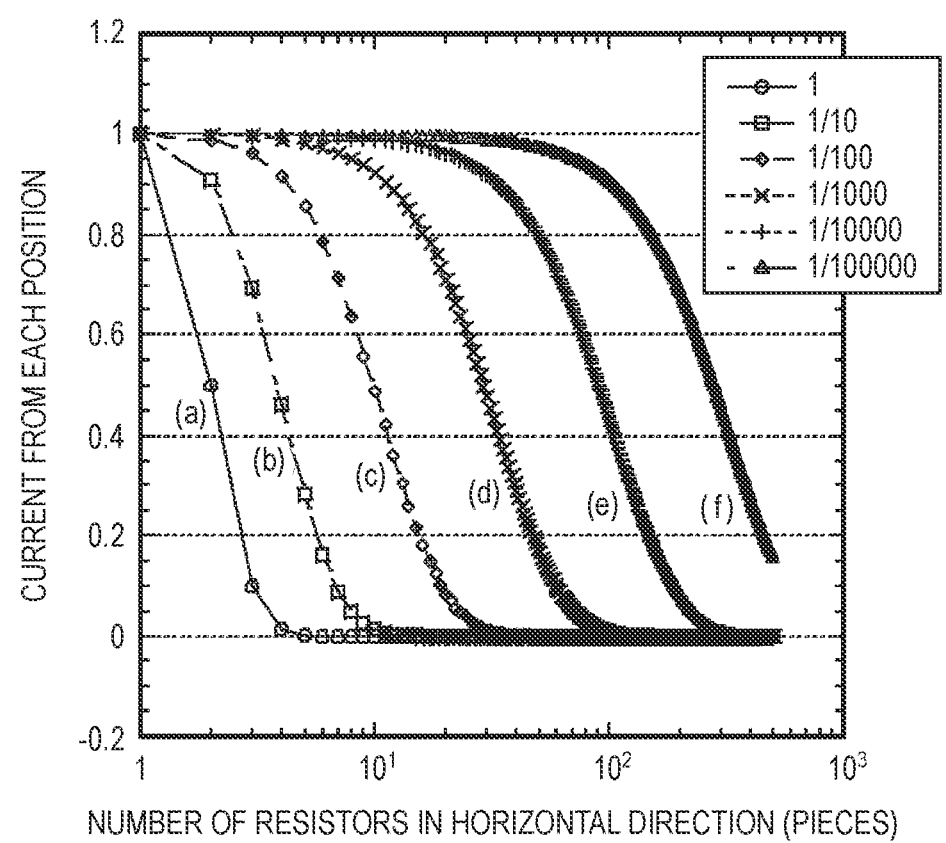
FIG. 4 is a graph showing calculation results of a distribution of current flowing through each resistor when $R_f=1\Omega$ and the voltage is 1 V in the circuit model of FIGS. 1A and 1B. Plots (a) show a case where $R_h=R_v=R_f$ having no conductive coating on the surface. Plots (b) show a case where $R_h=10^{-1}R_v$ having a conductive coating on the surface. Plots (c) show a case where $R_h=10^{-2}R_v$. Plots (d) show a case where $R_h=10^{-3}R_v$. Plots (e) show a case where $R_h=10^{-4}R_v$. Plots (f) show a case where $R_h=10^{-5}R_v$.

According to Formula (1), in the case of FIG. 1A in which no conductive coating exists on the resistor film, the combined resistor value does not greatly decrease from $R_l$ (see plots (a) in FIG. 2), and a total current amount does not increase significantly (see plots (a) in FIG. 3). In addition, most of the current flows only from a few resistors from the contact position of the measurement terminal (see plots (a) in FIG. 4), and a current from a distance cannot be collected due to an increase in the resistor value. In FIGS. 2 to 4, results of calculating the combined resistor value and a current value with $R_l$=1Ω are shown.

On the other hand, as shown in a model of FIG. 1B, when a conductive coating (resistor value: $R_c$) having a resistor value lower than that of a resistor film and an extremely thin thickness is formed on the resistor film, in a stacked film formed of the resistor film and the conductive coating, the electrical resistor value $R_v$ in the vertical (thickness) direction can be defined to be equal to $R_l$ of the resistor film, and the resistor value $R_h$ in the horizontal (in-plane) direction can be defined to be equal to a value when $R_l$ and $R_c$ are connected in parallel. The combined resistor value $R_{n+1}$ in this case is expressed by the following Formula (2).

[Formula 2]

$$R_{n+1} = \frac{1}{\frac{1}{R_n + R_h} + \frac{1}{R_1}} \quad (2)$$

In this case, the combined resistor value $R_{n+1}$ decreases significantly as $R_h$ is smaller than $R_v$(=$R_1$), in other words, the smaller $R_c$ is compared with $R_l$, the greater the decrease compared with $R_l$ (see plots (a) to (f) in FIG. 2). For example, when $R_h$ equal to a resistor value in which $R_l$ and $R_c$ are connected in parallel is one digit smaller than $R_v$(=$R_l$) (see plots (b) in FIG. 2), the combined resistor value is about half of a case of $R_h$=$R_v$, and when $R_h$ is two digits smaller than $R_v$(=$R_l$) (see plots (c) in FIG. 2), the combined resistor value is about ⅙ of the case of $R_h$=$R_v$. As the combined resistor value decreases, the total current amount flowing through the conductive coating increases greatly (see plots (b) to (f) in FIG. 3). A current also flows to a resistor at a position farther from the contact position of the measurement terminal (see plots (b) to (f) in FIG. 4). Hereinafter, this phenomenon may be referred to as a "spreading effect of current" in the description.

Figure 5B:
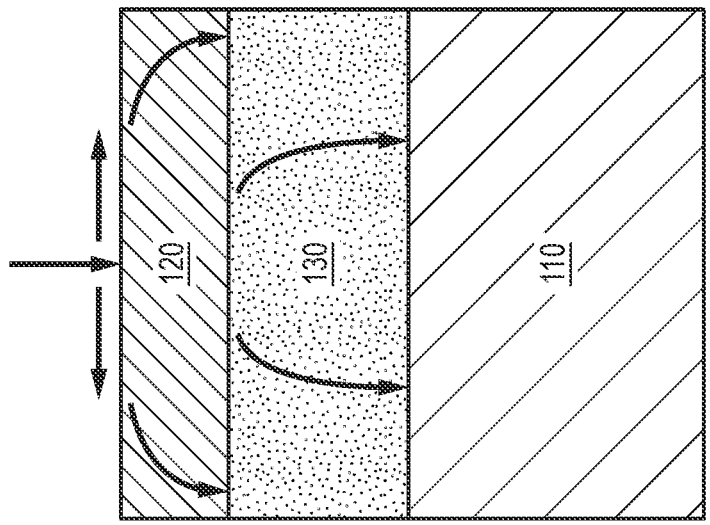
FIGS. 5A and 5B are diagrams of a spreading effect of a current in the conductive coating.
Figure 5A:
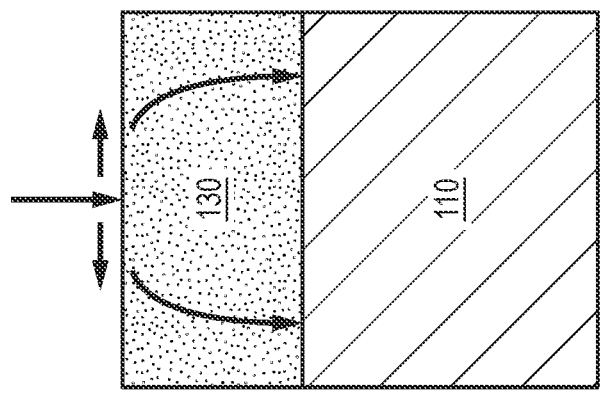

The spreading effect of the current is remarkable in a film formed of an anisotropic material having an extremely small electrical resistivity in the horizontal (in-plane) direction as compared with an electrical resistivity in the vertical (thickness) direction among conductive films. FIGS. 5A and 5B are diagrams showing a difference in the spreading effect of the current that occurs when a voltage is directly applied to the metal base material in which the resistor film exists (FIG. 5A), and when a voltage is applied to a conductive coating made of an anisotropic material having a smaller electrical resistor in the in-plane direction than in the thickness direction formed on the surface of a metal base material having a resistor film (FIG. 5B). As shown in the diagram, when the conductive coating of the anisotropic material is formed, a current amount flowing in the horizontal direction in a plane increases significantly, so that the current amount flowing through the metal base material increases significantly due to the spreading effect of the current. In FIGS. 5A and 5B, for a reference sign (number) 110 denotes a metal base material, 130 denotes an oxide film, and 120 denotes a graphene film, similar as in the embodiment to be described later.

Considering that the mechanism described above is applied to an actual situation, when the measurement terminal brought into direct contact with only a part of the surface of the metal base material, since an isotropic oxide film having a high electrical resistance is formed on the surface of the metal base material in many cases, the spreading effect of the current is prevented due to an influence of the oxide film, and a region where the current flows is limited only to a close proximity to the contact position of the measurement terminal. Therefore, the flowing current amount is limited and the measured resistor value increases.

On the other hand, when the measurement terminal is brought into contact with the graphene film formed on the surface of the metal base material, due to structural characteristics of a graphene, that is, a plane structure formed of a hexagon formed by carbon atoms and a bond thereof, and sp2-bonded carbon atoms, the electrical resistor value $R_c$ in the in-plane direction is significantly smaller than the electrical resistor value $R_I$ of the resistor film due to an oxide. Therefore, the spreading effect of the current is exhibited, and even when a high-resistance oxide film is present, the total current amount increases and the measured resistor value decreases.

[Connector Pair]

A connector pair according to an embodiment of the present invention (hereinafter, simply referred to as "the present embodiment") using the mechanism described above includes, as an example of the connector pair shown in FIG. 6, a first connector 10 and a second connector 20 electrically connected to the first connector, in which the first connector 10 includes an electrical contact part 100 provided with a graphene film 120 on a metal base material 110, the second connector 20 includes an electrical contact part 200 electrically connected to the first connector 10 via the graphene film 120, and a contact area between the electrical contact parts of the first connector 10 and the second connector 20 is smaller than an area of the graphene film 120 coating the metal base material 110.

The metal base material 110 in the electrical contact part 100 of the first connector 10 may be any material as long as the material has conductivity, and silver, copper, aluminum, nickel, or tin, an alloy containing the metals, or the like can be used. Stainless steel may also be used. Further, another metal layer may be formed on a surface by plating, vapor deposition, or the like.

A shape and size of the metal base material 110 may be appropriately determined according to a required performance, standard, and the like.

The metal base material 110 may be provided with an oxide film 130 of a metal for the metal base material 110 on the surface thereof. When the metal base material 110 includes the oxide film 130, an increase in the current becomes more significant caused by the spreading effect of the current by the graphene film 120. In other words, electrical resistance of the electrical contact part 100 is significantly reduced. In particular, when the metal base material 110 is copper and a cuprous oxide ($Cu_2O$) or a copper oxide (CuO) film 130 that is a copper oxide is formed on the surface of the metal base material 110, due to a high electrical resistance of the copper oxide, the decrease in the electrical resistance is remarkable.

The electrical contact part 100 of the first connector 10 includes the graphene film 120 on the metal base material 110. The graphene film 120 may be formed to cover the entire surface of the metal base material, or may be formed to cover only a part of the surface of the metal base material. A thickness of the graphene film 120 is not limited, and may be, for example, 0.335 nm to 1.0 mm. From a viewpoint of protecting the metal base material 110 from a deterioration factor (oxygen, moisture, or the like), the thickness of the graphene film 120 is preferably 1 nm or more, and more preferably 3 nm or more. On the other hand, from a viewpoint of preventing an increase in the electrical resistance, the thickness of the graphene film 120 is preferably 100 μm or less, and more preferably 100 nm or less.

A method of forming the graphene film 120 on the metal base material 110 is not limited, and for example, a gas phase method such as a CVD method or a method by a reduction treatment after coating and drying a liquid containing a graphene oxide can be adopted. Among the methods, the method by the reduction treatment of the graphene oxide is preferable in that graphene films having various film thicknesses can be easily obtained without requiring a large-scale device. In addition, this method is also preferable in that a reduced graphene oxide (rGO) excellent in conductivity is obtained.

The electrical contact part 100 of the first connector 10 may include a conductive polymer film (not shown) between the metal base material 110 and the graphene film 120. With such a configuration, due to a flexibility of the conductive polymer film, when the first connector 10 is connected to the second connector 20, a surface of the electrical contact part 100 is reversibly deformed according to a surface shape of the electrical contact part 200 of the second connector 20, and a larger contact area is obtained.

The electrical contact part 200 of the second connector 20 is configured to contact the graphene film 120 in the electrical contact part 100 of the first connector 10 with an area smaller than the area of the graphene film 120 coating the metal base material 110.

Examples of such electrical contact part 200 include a leaf spring, a slot terminal, and the like.

In a connector pair 1 according to the present embodiment, even when the contact area between the electrical contact parts 100 and 200 is small, due to the spreading effect of the current described above, the electrical resistance becomes low, and a sufficient current can flow. Therefore, it is not necessary to provide a mechanism for applying a large pressing force to increase the contact area between the electrical contact parts, and a size of the connector can be reduced. In addition, since the contact area between the electrical contact parts is small, a frictional resistance at the time of attachment and detachment is reduced, and the attachment and detachment can be easily performed.

EXAMPLES

Hereinafter, each embodiment of the present invention will be described more specifically based on examples, but the present invention is not limited to these examples.

Before experimentally confirming an effect of the present invention, it was estimated by calculation how much current can be passed through the electrical contact part in which the graphene film is formed on the surface of the metal base material.

Calculation Example 1

Figure 7:
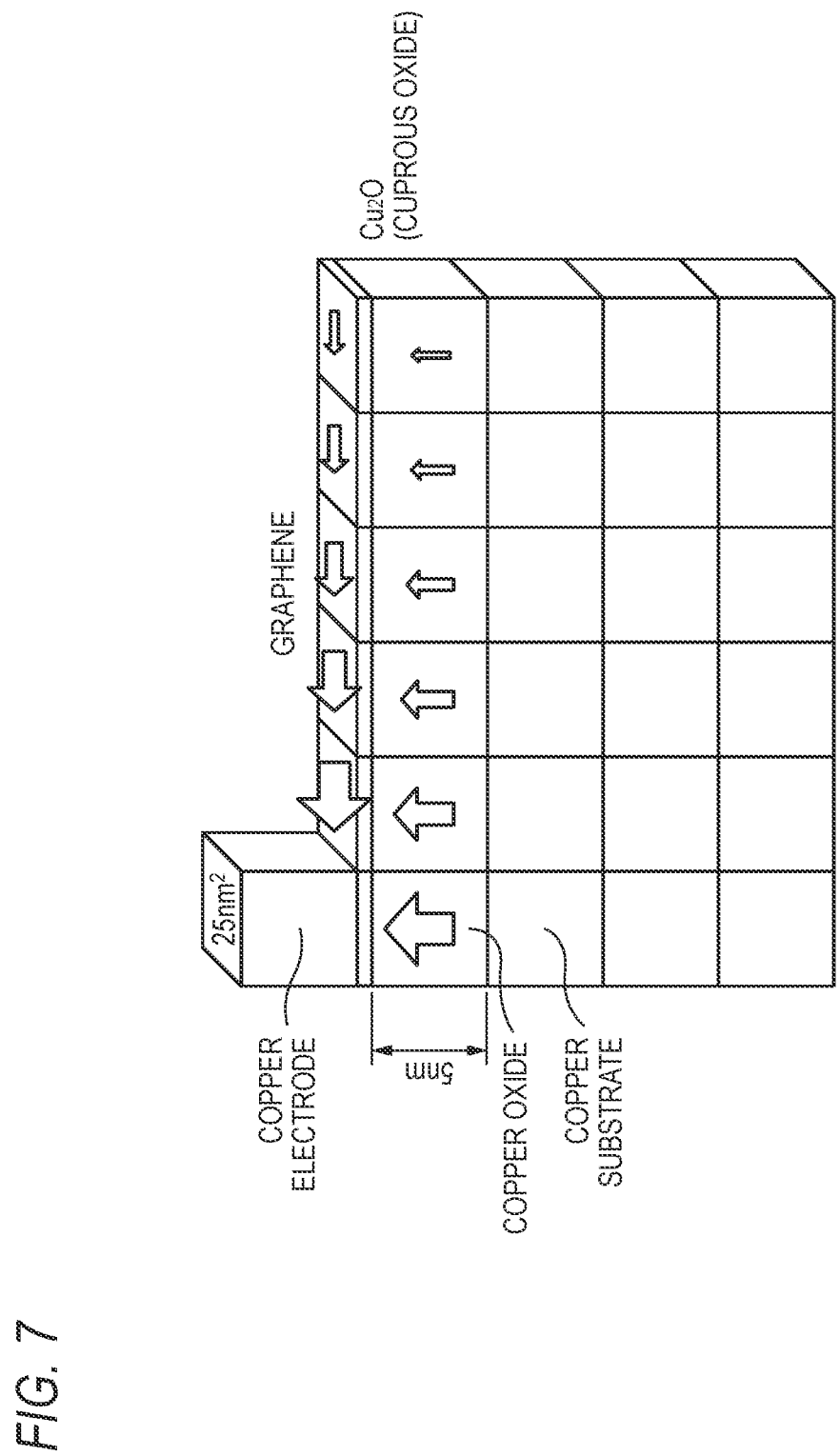
FIG. 7 is a diagram of a model used to calculate a change in a total current value with and without a graphene film coating on a copper base material having a cuprous oxide ($Cu_2O$) film on a surface.
Figure 8:
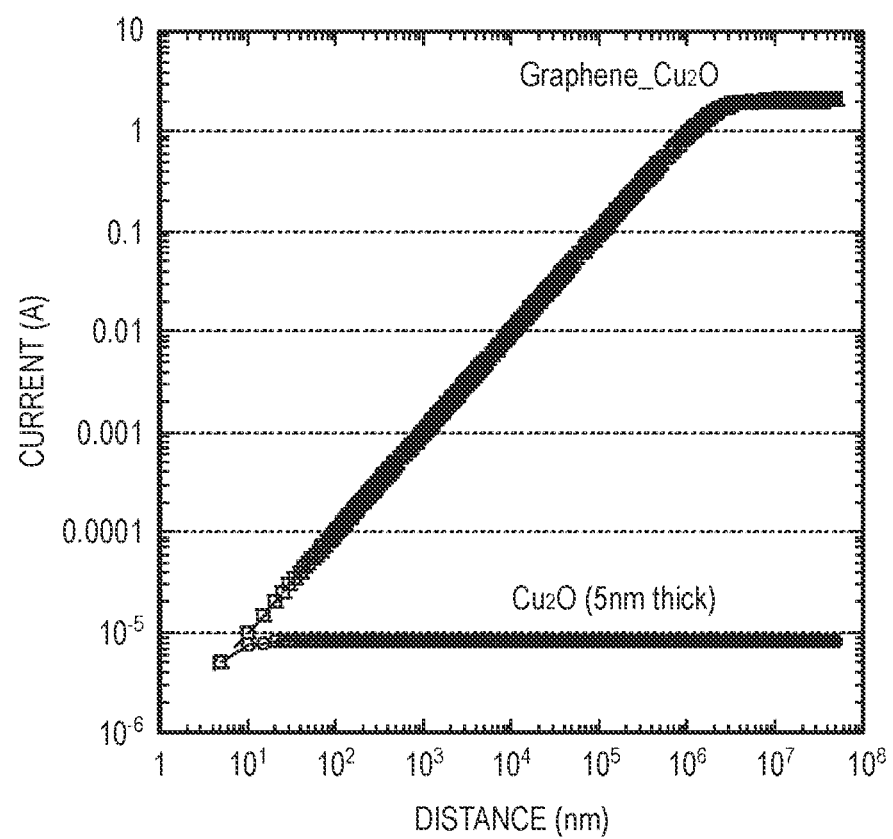
FIG. 8 is a graph showing the total current value calculated in the model of FIG. 7.

Assuming that a copper electrode having a square cross section with a side of 5 nm was brought into contact with an electrical contact part at each end in which a copper base material having a cuprous oxide ($Cu_2O$) film having a thickness of 5 nm on a surface and a single layer graphene film on the base material were formed, and a voltage of 1 V was applied, a current flowing for each in-plane distance from the copper electrode was calculated and plotted as an integrated value with respect to the in-plane distance. The electrical resistivity of each material was $1 \times 10^6$ $\Omega$m for $Cu_2O$ and $4 \times 10^{-7}$ $\Omega$m for the graphene film in the in-plane direction. Since the thickness of the graphene film was very thin in the single layer, the electrical resistor value in an inter-plane (thickness) direction thereof was calculated as zero. In addition, since the electrical resistivity of the metal copper in the base material was much smaller than that of $Cu_2O$, the electrical resistor value was also calculated as zero. A model used for the calculation (with formation of the graphene film) is shown in FIG. 7, and a calculation result is shown in FIG. 8.

As a result of the calculation, it was found that by forming the graphene film on the base material, a current of about 200,000 times can be passed.

Calculation Example 2

Figure 9:
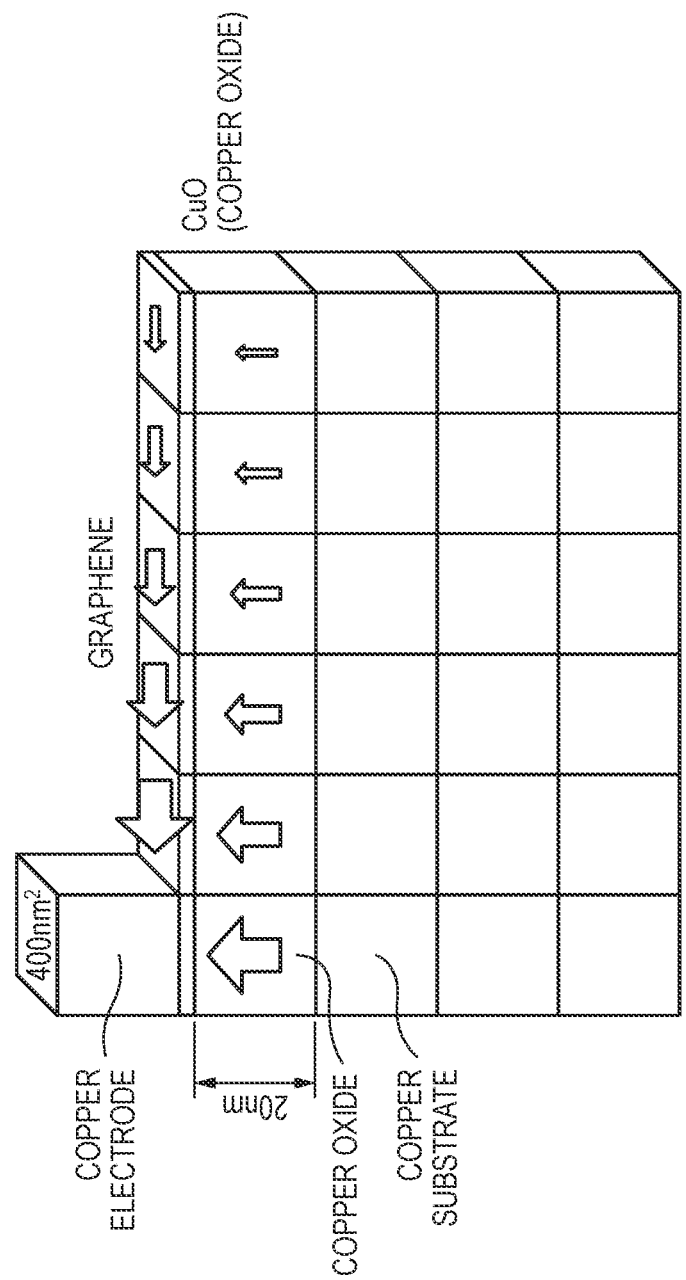
FIG. 9 is a diagram of a model used to calculate a change in the total current value with and without the graphene film coating on the copper base material having a copper oxide (CuO) film on the surface.
Figure 10:
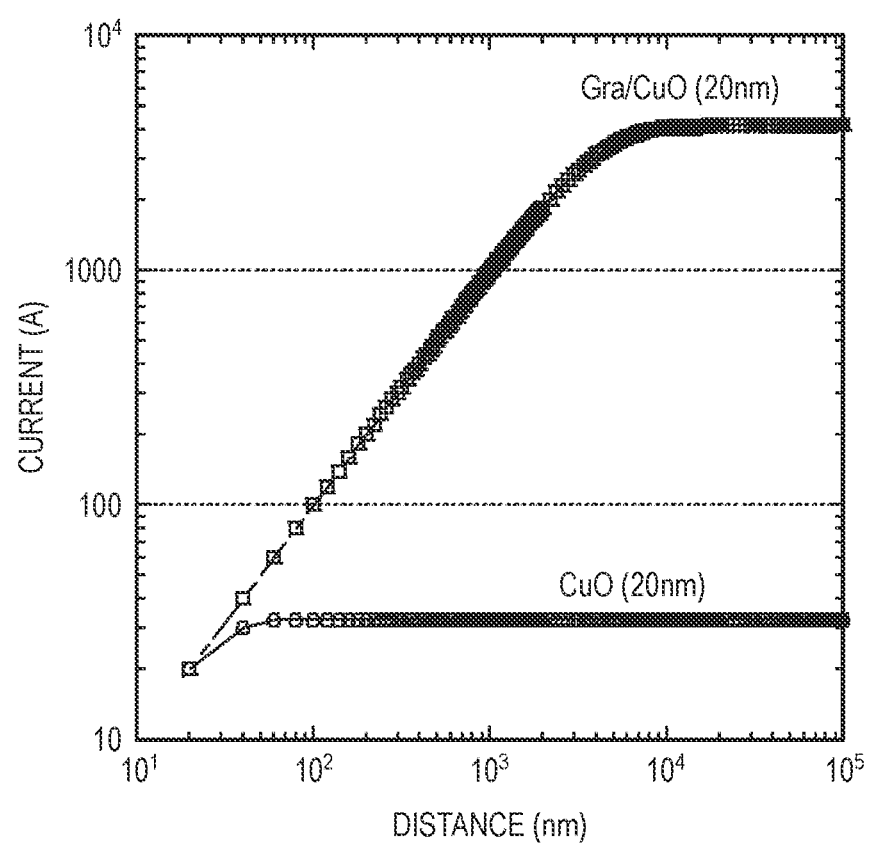
FIG. 10 is a graph showing the total current value calculated in the model of FIG. 9.

A current flowing through the electrical contact part was calculated similarly as in Calculation Example 1 except that a copper base material was assumed to have a copper oxide (CuO) film having a thickness of 20 nm on the surface and the copper electrode was assumed to have a square cross section with a side of 20 nm. An electrical resistivity of CuO was 1 $\Omega$m. A model used for the calculation (with formation of the graphene film) is shown in FIG. 9, and a calculation result is shown in FIG. 10.

As a result of the calculation, it was found that by forming the graphene film on the base material, a current of about 130 times can be passed.

Calculation Example 3

Figure 11:
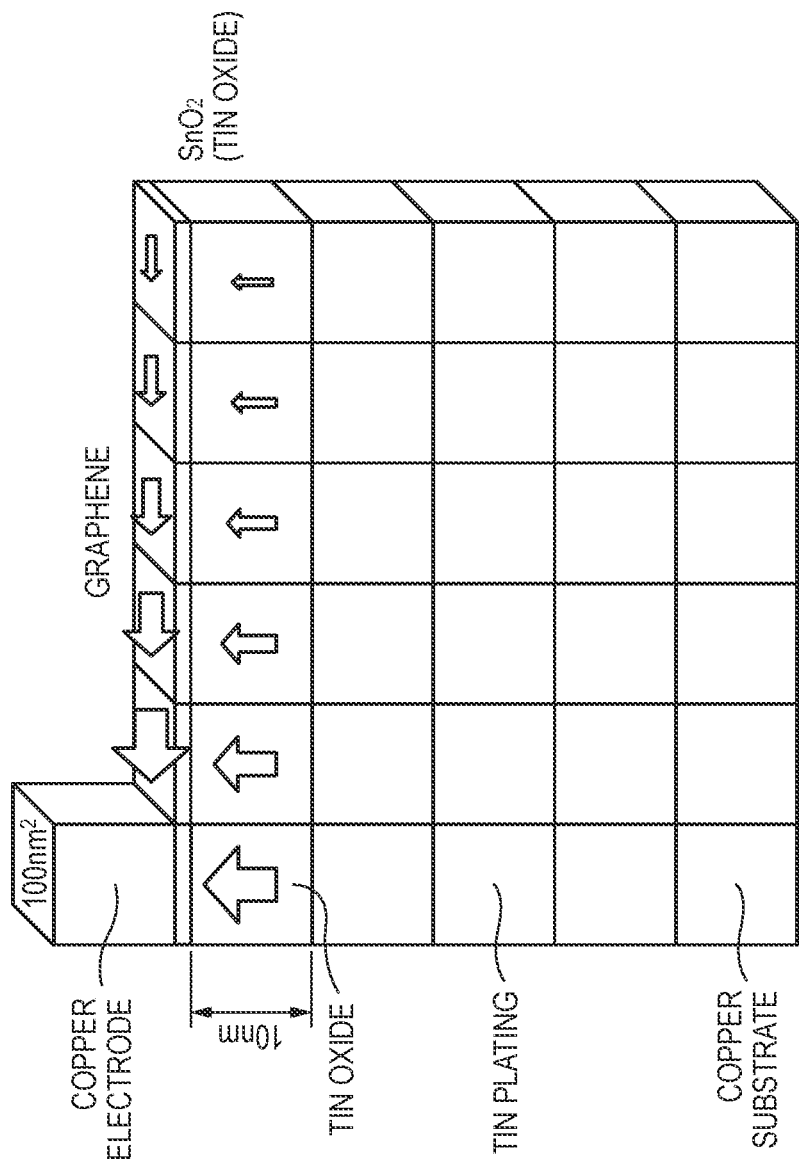
FIG. 11 is a diagram of a model used to calculate a change in the total current value with and without the graphene film coating on a tin base material formed on a copper substrate and having a tin oxide ($SnO_2$) film on a surface.
Figure 12:
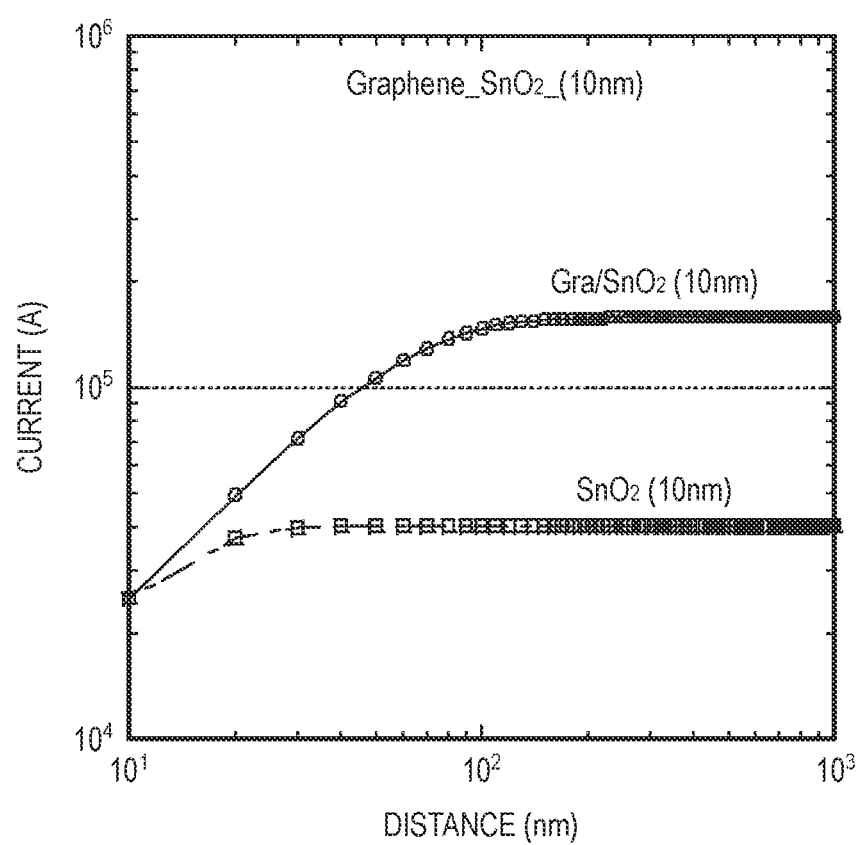
FIG. 12 is a graph showing the total current value calculated in the model of FIG. 11.

A current flowing through the electrical contact part was calculated similarly as in Calculation Example 1 except that a base material was assumed to be tin having a tin oxide ($SnO_2$) film having a thickness of 10 nm formed on a copper substrate and the electrode was assumed to be made of tin having a square cross section with aside of 10 nm. An electrical resistivity of tin was $12.8 \times 10^{-8}$ $\Omega$m, and an electrical resistivity of $SnO_2$ was $4 \times 10^{-4}$ $\Omega$m. A model used for the calculation (with formation of the graphene film) is shown in FIG. 11, and a calculation result is shown in FIG. 12.

As a result of the calculation, it was found that by forming the graphene film on the base material, a current of about 4 times can be passed.

Example 1

First, a terminal material (20×30×0.25 mm) made of a copper alloy (NB109) was prepared as a metal base material, and washed with 10% dilute sulfuric acid to remove a natural oxide film. Then, a graphene oxide (GO) film was formed on the metal base material by an electrophoretic deposition (EPD) method. Film forming conditions are as shown in Table 1. Then, an adhesive tape was affixed onto about half of the produced GO film and then peeled off to remove about half of the GO film. This operation is for measuring a film thickness of the finally formed graphene film and comparing current values with and without the graphene film. Finally, the metal base material on which the GO film was formed was heat-treated at 300° C. for 30 minutes in an Ar atmosphere to heat-reduce GO to the reduced graphene oxide (rGO), and an electrical contact part for the first connector according to Example 1 (hereinafter, simply referred to as "electrical contact part according to Example 1") was obtained.

TABLE 1

| GO DISPERSION CONCENTRATION [mg/L] | APPLIED VOLTAGE [V] | FILM FORMING TIME [min] | DISTANCE BETWEEN ELECTRODES [mm] |
| --- | --- | --- | --- |
| 4 | 3 | 5 | 10 |

Figure 13:
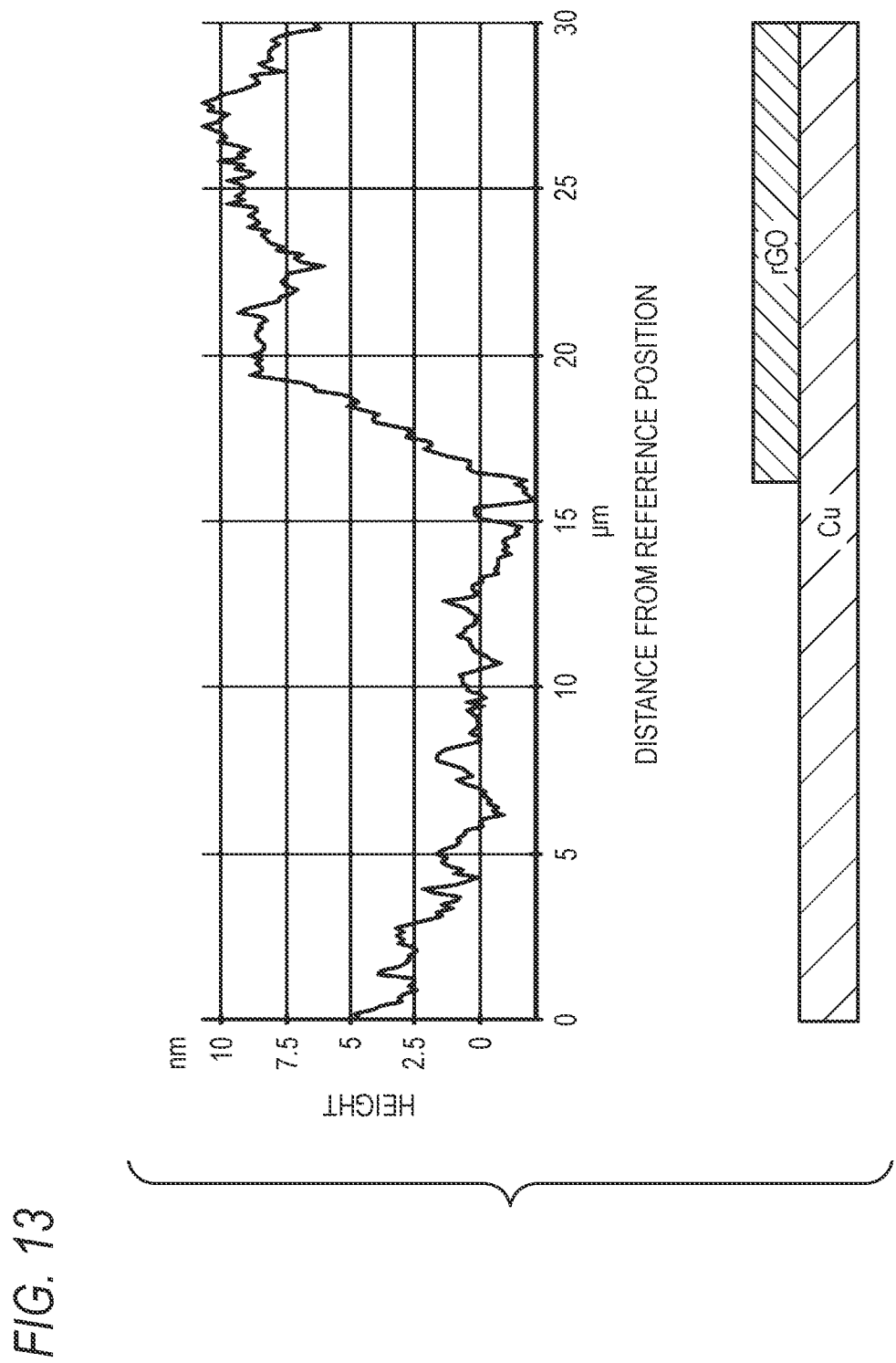
FIG. 13 is a graph showing a film thickness measurement result of the graphene film for the electrical contact part according to a first embodiment.

A film thickness of the graphene film of the electrical contact part according to Example 1 was measured using an atomic force microscope (AFM) (manufactured by Park systems, NX10 type). A result is shown in FIG. 13. From this result, it can be seen that an rGO film having a thickness of about 9 nm was formed on the copper base material.

Figure 14:
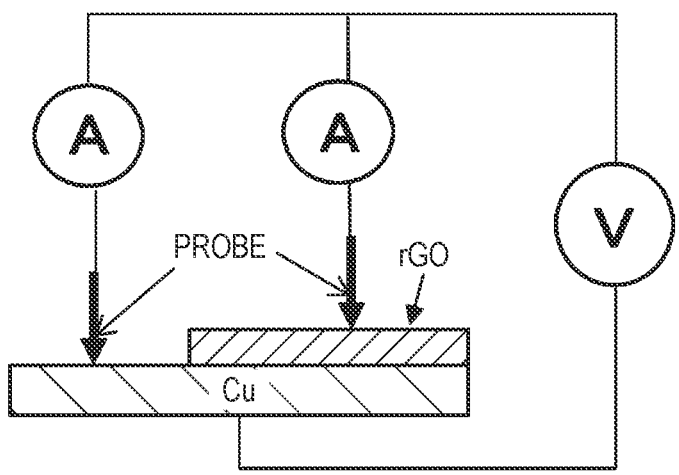
FIG. 14 is diagram showing a method of measuring a current flowing in a thickness direction for the electrical contact part according to the first embodiment.
Figure 15:
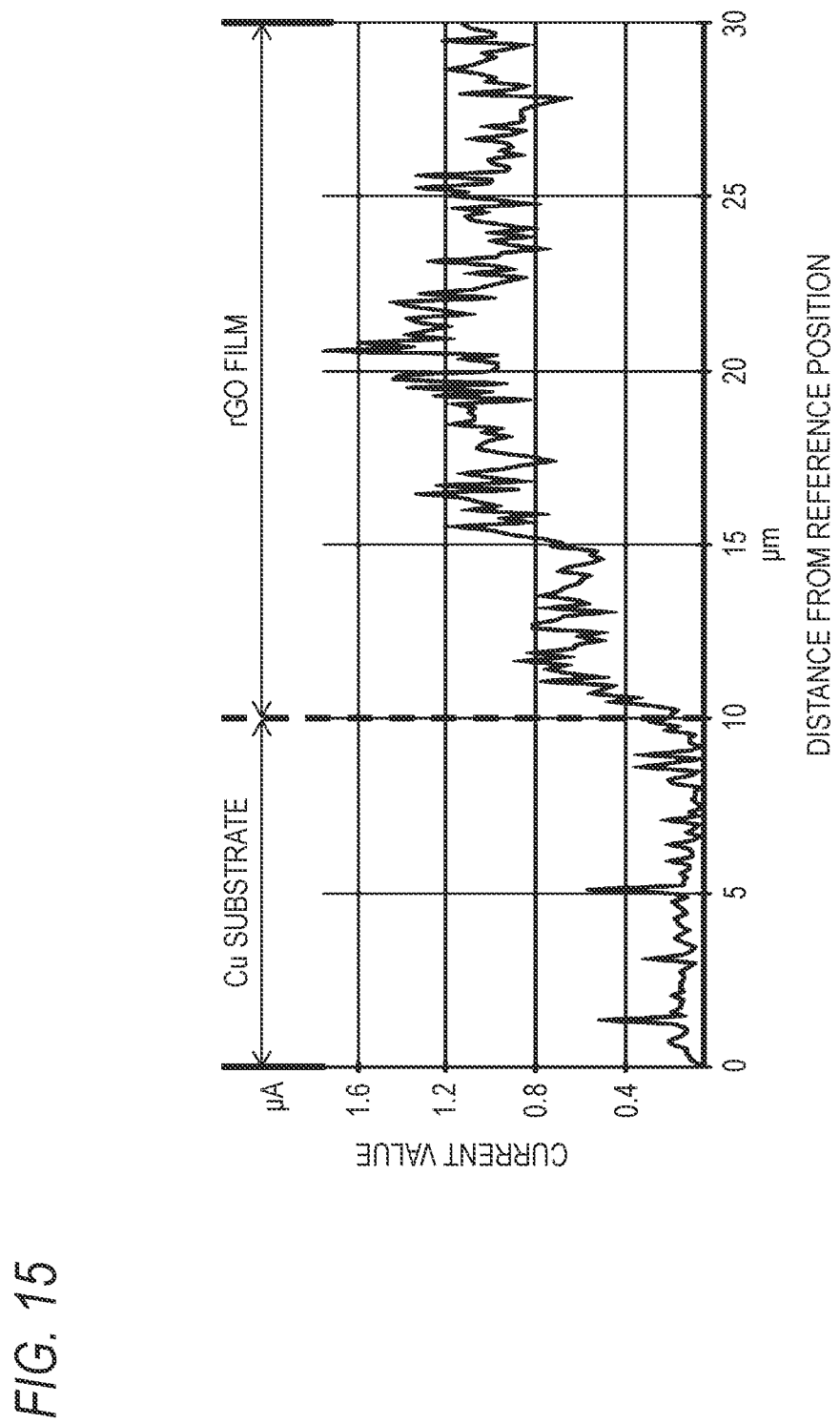
FIG. 15 is graph showing a measurement result of the current flowing in the thickness direction for the electrical contact part according to the first embodiment.
Figure 16:
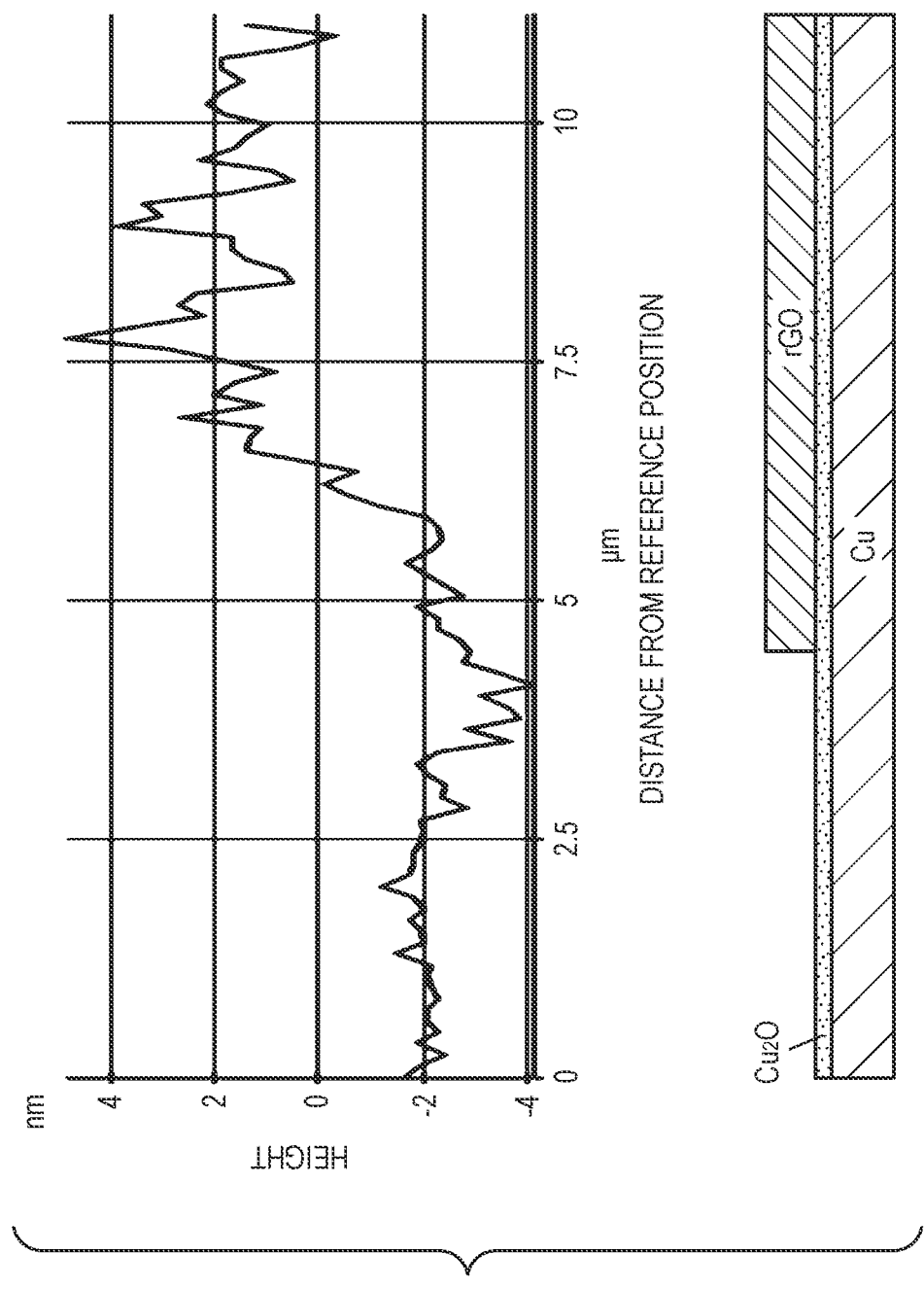
FIG. 16 is a graph showing a film thickness measurement result of the graphene film for the electrical contact part according to a second embodiment.

For the electrical contact part according to Example 1, a magnitude of a current flowing in the thickness direction under a constant voltage was measured using a conductive AFM. As shown in FIG. 14, the measurement was performed while changing a measurement position along a line segment from a copper substrate portion where the rGO film was not formed to an rGO film portion. The applied voltage was 1 V. A measurement result is shown in FIG. 15. From this result, it can be seen that a current value of the rGO film portion is larger than a current value of the copper substrate portion.

Example 2

First, a terminal material made of a copper alloy (NB109) was prepared as a metal base material, and a surface thereof was subjected to chemical mechanical polishing (CMP). Accordingly, it is said that a $Cu_2O$ layer is formed on a surface of the copper alloy (Huchi Uma, 3 others. "correlation between chemical mechanical polishing behavior and physical properties of surface products", Surface Technology. Vol. 63, No. 4, 2012, P. 252-). Next, the GO film was formed on the metal base material on which the $Cu_2O$ layer was formed on the surface by a similar method as in Example 1. Next, similar as in Example 1, an adhesive tape was affixed onto about half of the produced GO film and then peeled off to remove about half of the GO film. Finally, the copper base material on which the GO film was formed was heat-treated at 200° C. for 5 minutes in an Ar atmosphere to heat-reduce GO to the rGO, and an electrical contact part for the first connector according to Example 2 (hereinafter, simply referred to as "electrical contact part according to Example 2") was obtained.

The film thickness of the graphene film of the electrical contact part according to Example 2 was measured by a similar method as in Example 1. A result is shown in FIG.

16. From this result, it can be seen that an rGO film having a thickness of about 4 nm was formed on the copper base material.

Figure 17:
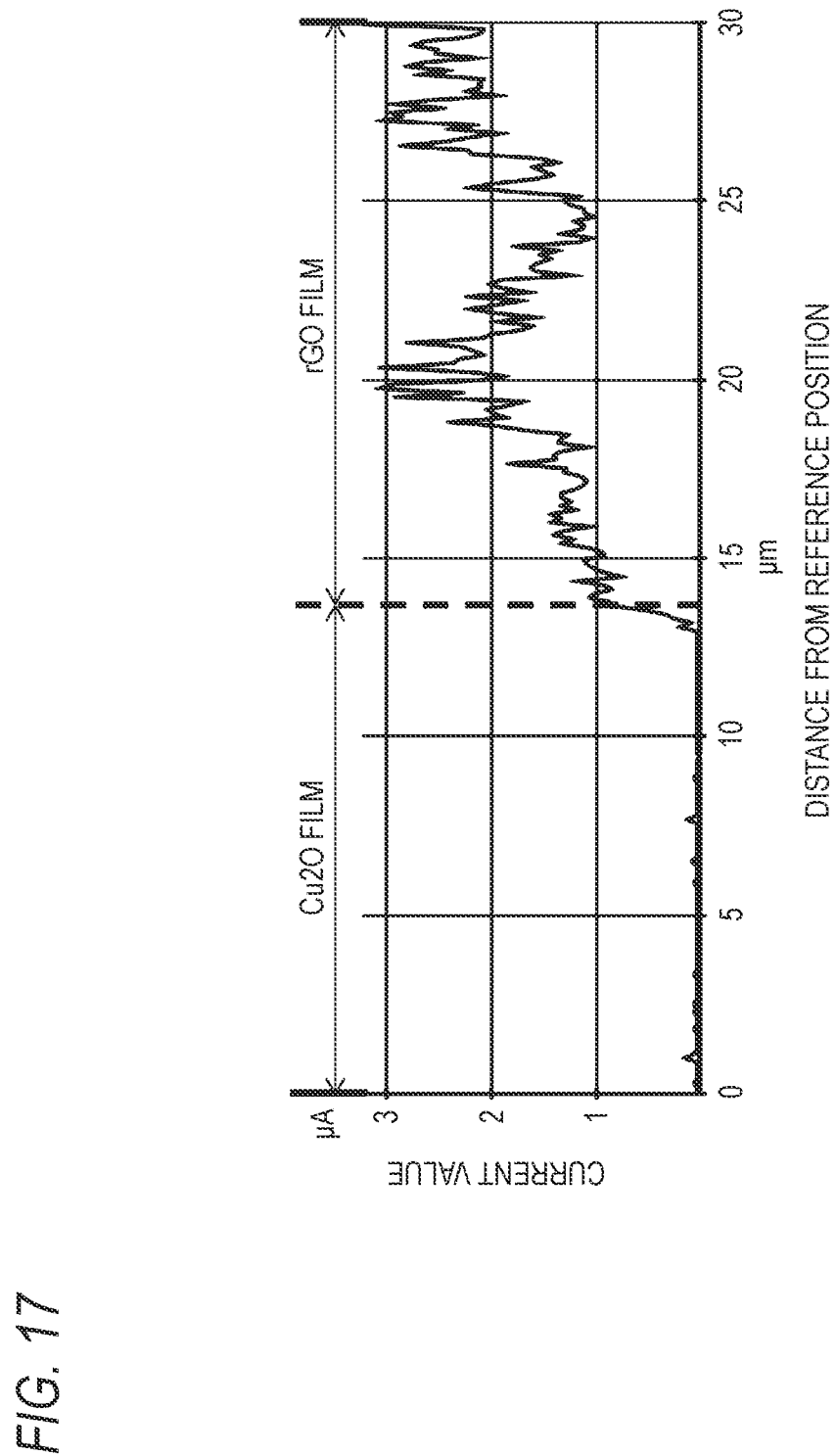
FIG. 17 is graph showing a measurement result of the current flowing in the thickness direction for the electrical contact part according to the second embodiment.

For the electrical contact part according to Example 2, a magnitude of a current flowing in the thickness direction under a constant voltage was measured by a similar method as in Example 1. A measurement result is shown in FIG. 17. From this result, it can be seen that a current value of the rGO film portion is larger than a current value of the copper substrate portion. From a comparison with the result of Example 1 (see FIG. 15), it can be seen that an effect of improving the conductivity due to the formation of the graphene film is further enhanced in the metal base material having an insulating oxide film on the surface.

According to one or more embodiments, it is possible to provide a connector and a connector pair having a low electrical resistor value in which a decrease in conductivity due to oxidation is prevented.

Here, characteristics of the embodiment of the connector and the connector pair according to the present invention described above are briefly summarized in the following [1] to [5].

[1] A connector pair (1) including:
  a first connector (10); and
  a second connector (20) electrically connected to the first connector (10),
  wherein the first connector (10) includes a first electrical contact part (100) provided with a graphene film on a metal base material (110),
  the second connector (20) includes a second electrical contact part (200) electrically connected to the first connector (10) via the graphene film, and
  a contact area between the first electrical contact part (100) and the second electrical contact part (200) is smaller than an area of the graphene film coating the metal base material (110).

[2] The connector pair (1) according to [1],
  wherein the metal base material (110) in the first electrical contact part (100) includes an oxide film of a metal on a surface thereof.

[3] The connector pair (1) according to [2],
  wherein the metal base material (110) is copper, and the oxide film is cuprous oxide or copper oxide.

[4] The connector pair (1) according to any one of [1] to [3],
  wherein the graphene film is reduced graphene oxide.

[5] The connector pair (1) according to any one of [1] to [4],
  wherein the first electrical contact part (100) further includes a conductive polymer film between the metal base material (110) and the graphene film.

[6] A connector used as the first connector (100) of the connector pair (1) according to any one of [1] to 5, the connector including:
  an electrical contact part provided with a graphene film on a metal base material (110).

What is claimed is:

1. A connector pair comprising:
  a first connector; and
  a second connector electrically connected to the first connector,
  wherein the first connector includes a first electrical contact part provided with a graphene film on a metal base material,
  the second connector includes a second electrical contact part electrically connected to the first connector via the graphene film, and
  a contact area between the first electrical contact part and the second electrical contact part is smaller than an area of the graphene film coating the metal base material.

2. The connector pair according to claim 1,
  wherein the metal base material in the first electrical contact part includes an oxide film of a metal on a surface thereof.

3. The connector pair according to claim 2,
  wherein the metal base material is copper, and the oxide film is cuprous oxide or copper oxide.

4. The connector pair according to claim 1,
  wherein the graphene film is reduced graphene oxide.

5. The connector pair according to claim 1,
  wherein the first electrical contact part further includes a conductive polymer film between the metal base material and the graphene film.

6. A connector used as the first connector of the connector pair according to claim 1.

* * * * *